United States Patent
Yarita et al.

(10) Patent No.: US 12,117,724 B2
(45) Date of Patent: Oct. 15, 2024

(54) MASK BLANK GLASS SUBSTRATE

(71) Applicant: Shin-Etsu Chemical Co., Ltd., Tokyo (JP)

(72) Inventors: Naoki Yarita, Joetsu (JP); Daijitsu Harada, Joetsu (JP); Masaki Takeuchi, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 18/495,139

(22) Filed: Oct. 26, 2023

(65) Prior Publication Data
US 2024/0053675 A1 Feb. 15, 2024

Related U.S. Application Data

(63) Continuation of application No. 17/333,379, filed on May 28, 2021, now Pat. No. 11,835,853.

(30) Foreign Application Priority Data

Jun. 9, 2020 (JP) .................................. 2020-099745

(51) Int. Cl.
*G03F 1/60* (2012.01)
(52) U.S. Cl.
CPC ...................... *G03F 1/60* (2013.01)
(58) Field of Classification Search
CPC ........................................................ G03F 1/60
See application file for complete search history.

(56) References Cited

U.S. PATENT DOCUMENTS

| | | | |
|---|---|---|---|
| 2011/0287219 A1* | 11/2011 | Matsui | B82Y 10/00 428/141 |
| 2015/0017574 A1* | 1/2015 | Orihara | C03C 3/06 430/311 |
| 2015/0331312 A1 | 11/2015 | Hamamoto et al. | |
| 2016/0223898 A1 | 8/2016 | Nakanishi | |

FOREIGN PATENT DOCUMENTS

| JP | 2016-143791 A | 8/2016 |
|---|---|---|
| WO | WO 2013/146990 A1 | 10/2013 |
| WO | WO 2014/104276 A1 | 7/2014 |

OTHER PUBLICATIONS

Kandaka et al. "Measurement of EUV scattering from Mo/Si multilayer mirrors," Applied Science, 2003, p. 257.

* cited by examiner

*Primary Examiner* — David Sample
*Assistant Examiner* — Donald M Flores, Jr.
(74) *Attorney, Agent, or Firm* — Birch, Stewart, Kolasch & Birch, LLP

(57) ABSTRACT

A mask blank glass substrate having a maximum value of a circularly averaged power spectral density of 1,000 $nm^4$ or less at a spatial frequency of 0.1 $\mu m^{-1}$ or more and 20 $\mu m^{-1}$ or less, the maximum value being obtained by measuring a surface morphology of a region of 10 $\mu m \times 10$ $\mu m$ with an atomic force microscope.

10 Claims, No Drawings

MASK BLANK GLASS SUBSTRATE

CROSS-REFERENCE TO RELATED APPLICATION

This application is a Continuation of application Ser. No. 17/333,379, filed on May 28, 2021, which claims priority under 35 U.S.C. § 119(a) to Application No. 2020-099745, filed in Japan on Jun. 9, 2020, all of which are hereby expressly incorporated by reference into the present application.

TECHNICAL FIELD

The present invention relates to a mask blank glass substrate, and more specifically to a mask blank glass substrate used for EUV lithography for leading edge applications.

BACKGROUND ART

In recent years, EUV lithography (hereinafter abbreviated as "EUVL"), which is an exposure technique using extreme ultra violet (EUV) light, has attracted attention in order to realize the formation of fine patterns that exceed those of a conventional photolithography method using ultraviolet rays.

The EUV light is light having a wavelength band in a soft X-ray region having a wavelength of about 0.2 to 100 nm or a vacuum ultraviolet region, and a reflective mask is expected as a transfer mask used in the EUVL.

A substrate used for the reflective mask is required to have a surface having extremely reduced surface roughness, flatness, and number of minute defects.

In particular, the increase in the reflectance of the EUV light in the reflective mask is important for improving throughput in an EUVL exposure step, and for that purpose, it is necessary to reduce the surface roughness of a reflective mask blank substrate.

An atomic force microscope is generally used to measure the surface roughness of a substrate. For example, Non-Patent Document 1 has reported that the surface roughness (RMS) of a substrate measured by an atomic force microscope in a 10-μm square region and the reflectance of EUV light after the formation of a reflective film are correlated with each other.

Meanwhile, Patent Document 1 has reported a reflective mask substrate and a processing method therefor. The reflective mask substrate has surface roughness (RMS) of 0.15 nm or less obtained by measuring a region of 1 μm×1 μm with an atomic force microscope and a power spectrum density (PSD) of 10 nm$^4$ or less at a spatial frequency of 1 μm$^{-1}$ or more and 10 μm$^{-1}$ or less.

Patent Document 2 has reported a substrate having a PSD of 4×10$^6$ nm$^4$ or less at a spatial frequency of 1×10$^{-2}$ μm$^{-1}$ or more in a range of 0.14×0.1 mm and PSD of 10 nm$^4$ or less in a spatial frequency range of 1 μm$^{-1}$ in 1-μm square.

Furthermore, Patent Document 3 has reported a mask blank glass substrate in which an aspect ratio Str (s=0.2) (ISO 025178-2) of a surface profile is controlled to 0.30 or more to facilitate the removal of a foreign matter existing on a surface.

Citation List

Patent Document 1: WO 2013/146990
Patent Document 2: WO 2014/104276
Patent Document 3: JP-A 2016-143791
Non-Patent Document 1: Noriaki Kandaka, Katsuhiko Murakami,
PF NEWS Vol. 26, No. 1, P. 24-25, 2008

SUMMARY OF THE INVENTION

However, the reflectance of the EUV light also depends on the spatial period of the surface roughness as with the diffraction phenomenon of X-rays, so that a high reflectance is not always obtained after the formation of the reflective film by merely managing the surface roughness with the RMS as in the technique of Non-Patent Document 1.

In recent studies, a PSD at a smaller spatial frequency of around 0.1 μm$^{-1}$ than that reported in Patent Documents 1 and 2 has a large effect on the reflectance. It has been found that, if the PSD in this range is not precisely controlled, a stable reflectance is not obtained.

In addition, a titanium-doped glass substrate, which is generally used for an EUV reflective mask blank substrate, may have a titanium concentration distribution occurring in a material. This titanium concentration distribution may cause a periodic structure to occur in a height direction in a relatively macro mm-order region of the surface of the substrate. This periodic structure has a height of about several nm to 10 nm, and becomes a factor that causes deteriorated flatness in a reflective mask blank substrate that requires flatness (TIR) of less than 30 nm. Also in this respect, by simply specifying the PSD in the spatial frequency range described in Patent Documents 1 and 2, various characteristics comprehensively required for the reflective mask blank substrate are insufficiently satisfied, so that PSD control in a wider range is required.

Meanwhile, the technique of Patent Document 3 certainly facilitates the removal of the foreign matter, which may provide reduced minute defects, but if the PSD is not observed over a wider range of spatial frequencies as described above, and the surface structure is not comprehensively controlled, it is difficult to satisfy required characteristics such as a reflectance and flatness.

The present invention has been made in view of the above circumstances, and it is an object of the present invention to provide a mask blank glass substrate which has a surface being highly flat, having low defects and low surface roughness, has a sufficiently high reflectance of EUV light after the formation of a reflective film, and is suitable as an EUVL mask blank substrate for leading edge applications.

As a result of diligent studies to achieve the above object, the present inventors have found that a substrate in which a maximum value of a circularly averaged power spectral density calculated by measuring a region of 10 μm×10 μm in a surface with an atomic force microscope is specified to a predetermined value or less is useful for increasing the reflectance of EUV light after the formation of a reflective film, and have completed the present invention.

That is, the present invention provides the following 1 to 6:

1. A mask blank glass substrate having a maximum value of a circularly averaged power spectral density of 1,000 nm$^4$ or less at a spatial frequency of 0.1 μm$^{-1}$ or more and 20 μm$^{-1}$ or less, the maximum value being obtained by measuring a surface morphology of a region of 10 μm×10 μm with an atomic force microscope;
2. The mask blank glass substrate according to 1, wherein, when the circularly averaged power spectral density is expressed by a function $af^\beta$ of the spatial frequency (f), a coefficient β (fractal coefficient) at the spatial frequency (f) of 1 μm$^{-1}$ or more and 10 μm$^{-1}$ or less is 0.7 or more;

3. The mask blank glass substrate according to 1 or 2, wherein a value of surface roughness (RMS) obtained by measuring the surface morphology of the region of 10 μm×10 μm with the atomic force microscope is 0.15 nm or less;
4. The mask blank glass substrate according to 1 to 3, wherein a maximum value of a circularly averaged power spectral density at a spatial frequency of 0.4 mm$^{-1}$ or more and 100 mm$^{-1}$ or less is 10$^{12}$ nm$^4$ or less, the maximum value being obtained by measuring a surface morphology of a region of 6 mm×6 mm with a white light interferometer;
5. The mask blank glass substrate according to any one of 1 to 4, wherein flatness (TIR) of a region of 142 mm×142 mm is 100 nm or less; and
6. The mask blank glass substrate according to any one of 1 to 5, wherein the mask blank glass substrate is a titania-doped synthetic quartz glass substrate containing 5 to 10 wt % of titania.

ADVANTAGEOUS EFFECTS OF THE INVENTION

The mask blank glass substrate of the present invention has characteristics of having a surface being highly flat, and having low defects and small surface roughness, and having a sufficiently high reflectance of EUV light after formation of a reflective film, and is suitable as an EUVL mask blank substrate.

DESCRIPTION OF THE PREFERRED EMBODIMENT

Hereinafter, the present invention is described in more detail.

A mask blank glass substrate of the present invention is used as a glass substrate for semiconductors when performing a lithography technique for fine lithography using EUV light.

The size of the mask blank glass substrate is not particularly limited, and may be any size. For use in a current EUVL exposure apparatus, a 6-inch square substrate used as a normal photomask blank substrate is preferable, and examples thereof include a square-shaped 6025 substrate of 152 mm×152 mm×6.35 mm.

The material is not also particularly limited, but it is necessary to use a substrate having a small coefficient of thermal expansion in an exposure step in EUVL, whereby titania-doped synthetic quartz glass obtained by doping synthetic quartz glass with titania at a concentration of 5 to 10 wt % is preferable.

The mask blank glass substrate of the present invention has a maximum value of a circularly averaged power spectral density of 1,000 nm$^4$ or less at a spatial frequency of 0.1 μm$^{-1}$ or more and 20 μm$^{-1}$ or less in order to exhibit a reflectance sufficient for EUV light after the formation of a multilayer reflective film. The maximum value is obtained by measuring a surface morphology of a region of 10 μm×10 μm on the substrate with an atomic force microscope.

A circularly averaged power spectral density PSD (f), which is a function of a spatial frequency f, is calculated discrete Fourier transform F (u, v) of a surface morphology Z (Px, Py) of a glass substrate. F (u, v) is calculated by the following formula (1).

$$F(u, v) = \sum_{p_x=0}^{N_x-1} \sum_{p_y=0}^{N_y-1} Z(p_x, p_y)\exp\left[-i2\pi\left(\frac{up_x}{(N_x)} + \frac{vp_y}{N_y}\right)\right] \quad (1)$$

Here, Nx and Ny are the numbers of measurement points in x and y directions when the surface morphology of the glass substrate is measured. Px and Py are integers indicating the positions of the measurement points in the x and y directions, and are values of Px=0, 1, . . . , Nx−1, Py=0, 1, . . . , Ny−1. Meanwhile, u and v are values of u=−1/2, −1/2+1/Nx, . . . , 1/2, and v=−1/2, −1/2+1/Ny, . . . , 1/2.

By normalizing F (u, v) with measurement pitches Δx and Δy in the x and y directions and an area A=(NxΔx)×(NyΔy) of a measurement region as shown in the following formula (2), a power spectral density P (u, v) can be obtained.

$$P(u, v) = \frac{1}{A}|F(u, v)\Delta x\Delta y|^2 = \frac{A}{(N_xN_y)^2}|F(u, v)|^2 \quad (2)$$

Without this normalization, it is not possible to simply compare the power spectral densities calculated from the conditions of different measurement regions and measurement pitches.

Meanwhile, the spatial frequency f (u, v) is expressed by the following formula (3).

$$f = \sqrt{\left(\frac{u}{\Delta x}\right)^2 + \left(\frac{v}{\Delta y}\right)^2} \quad (3)$$

The circularly averaged power spectral density PSD (f) is obtained b averaging the power spectral density P (u, v) with respect to the spatial frequency f (u, v) as shown in the following formula (4).

$$PSD(f) = \sum_{f^2<(u/\Delta x)^2+(v/\Delta y)^2\leq(f+\Delta f)^2} \frac{1}{N_f}P(u, v) \quad (4)$$

Here, Nf is the number of measurement points that satisfy the following formula (5).

$$f^2<(u/\Delta x)^2+(v/\Delta y)^2\leq(f+\Delta f)^2 \quad (5)$$

If NxΔx=NyΔy is set, Δf is defined by the following formula (6).

$$\Delta f = \frac{1}{N_x\Delta x} = \frac{1}{N_y\Delta y} \quad (6)$$

The maximum value of the circularly averaged power spectral density PSD (f) may be 1,000 nm$^4$ or less, but it is preferably 750 nm$^4$ or less in consideration of further increasing the reflectance of EUV light after the formation of the multilayer reflective film.

The atomic force microscope can be appropriately selected from conventionally known atomic force microscopes, and used. Specific examples thereof include Cypher ES manufactured by Oxford Instruments.

When the circularly averaged power spectral density is expressed by the function af$^β$ of the spatial frequency (f) in the above mask blank glass substrate, a coefficient β (fractal coefficient) at the spatial frequency (f) of $1\ \mu m^{-1}$ or more and $10\ \mu m^{-1}$ or less is preferably 0.7 or more, and more preferably 0.8 or more. The curve of the circularly averaged power spectral density PSD quickly decays from a low frequency side to a high frequency side as the value of the fractal coefficient increases. Therefore, by controlling not only the maximum value of the PSD but also the fractal coefficient in such ranges, the surface roughness in a wide frequency band can be reduced. As a result, the reflectance of the EUV light after the formation of the multilayer reflective film is increased. Furthermore, a high-frequency roughness component that may become noise during pattern formation can be effectively suppressed.

Furthermore, the value of the surface roughness (RMS) obtained by measuring the surface morphology of the region of 10 μm×10 μm with the atomic force microscope is preferably 0.15 nm or less, and more preferably 0.10 nm or less. The PSD is the average of roughness components in all angular directions in the measurement area as a function of the spatial frequency, so that surface roughness derived from a specific surface structure such as a structure that occurs only in a specific angular direction may not be reflected. Therefore, by controlling the value of RMS, which is an index indicating the surface roughness of the entire measured view, within the range, the influence of the surface structure that reduces the reflectance of the EUV light after the formation of the multilayer reflective film can be further eliminated.

As described above, in the titania-doped synthetic quartz glass substrate, a periodic structure in a height direction is caused by a titanium concentration distribution. As a result, the flatness of the substrate may be deteriorated to cause reduced accuracy of the exposure step. Therefore, in order to realize a highly accurate exposure step, it is preferable to manage the PSD in a wider measured view.

Therefore, in the mask blank glass substrate of the present invention, a maximum value of a circularly averaged power spectral density at a spatial frequency of $0.4\ mm^{-1}$ or more and $100\ mm^{-1}$ or less is $10^{12}\ nm^4$ or less. The maximum value is obtained by measuring the surface morphology of a region of 6 mm×6 mm with a white light interferometer. For the same reason, the flatness (TIR) of a region of 142 mm×142 mm is preferably 100 nm or less, and more preferably 50 nm or less.

The white light interferometer can be appropriately selected from conventionally known white light interferometers, and used. Specific examples thereof include Nex View manufactured by Zygo.

The mask blank glass substrate of the present invention can be manufactured by a method including a rough polishing step of roughly polishing a raw material substrate obtained by molding, annealing, slicing, chamfering, and lapping a glass ingot as a material, a flatness measuring step of measuring the flatness of the surface of the roughly polished substrate, a partial polishing step of subjecting the substrate to partial polishing, a finish polishing step of subjecting the substrate to finish polishing, and a cleaning step of cleaning the substrate with a chemical solution.

The rough polishing step can be carried out using, for example, a cerium oxide-based abrasive as an abrasive in a double-sided polishing machine that performs planetary motion.

Following the rough polishing step, the flatness of the substrate surface is measured in the flatness measuring step. In order to reduce a processing time in the subsequent partial polishing step, the flatness (TIR) of the region of 142 mm×142 mm is preferably in the range of 100 to 1,000 nm at the completion of the rough polishing step. The flatness can be measured using a commercially available flatness tester for photomasks, for example, UltraFlat manufactured by Tropel, and the like.

In the partial polishing step, it is preferable to adopt a partial polishing technique using a small-size rotary processing tool in order to configure the mask blank glass substrate of the present invention into a desired shape. In the flatness measuring step, an amount to be polished at each site in the substrate surface is determined based on the measurement data of the substrate surface measured in advance, and partial polishing is performed toward a preset target shape. The amount to be polished is controlled by the travel speed of the tool. That is, when a larger amount to be polished is desired, the travel speed of the tool across the substrate surface is slowed. When the amount to be polished ma become smaller as approaching to the target shape, the travel speed of the tool across the substrate surface may be adversely accelerated to control the amount to be polished.

A processing part of the small-size rotary processing tool for partial polishing is not particularly limited, but it is preferable to adopt a processing part using a Leutor type rotary processing tool.

Here, from the viewpoint of reducing the damage to glass by polishing, the material of the rotary processing tool in contact with the glass may be selected from polyurethane, felt buff, rubber and cerium pads having hardness A50 to 75 (based on JIS K6253) and the like, but the type of the material is not limited thereto as long as the glass surface can be ground.

Examples of the shape of the polishing processing part of the rotary processing tool include, but are not particularly limited to, a circle, doughnut, cylinder, cannonball, disk, and barrel shapes.

The flatness (TIR) of the region of 142 mm×142 mm of the substrate surface after the partial polishing step is preferably 100 nm or less, and more preferably 50 nm or less, and the shape can be arbitrarily selected depending on the final-finish polishing conditions and specifications of a convex and a concave and the like.

In the finish polishing step, the substrate after the partial polishing step is subjected to batchwise polishing by ordinary single wafer type polishing to eliminate defects and surface roughness which have been introduced until the partial polishing step. At this time, a suede polishing cloth is suitably used. If a polishing rate is high, the shape configured by the partial polishing rapidly changes to the final target shape, which makes it difficult to control the shape. Therefore, it is preferable that the polishing rate is not so high.

In the finish polishing step, finish polishing is carried out using abrasive grains. As the abrasive grains, a colloidal silica aqueous dispersion is suitably used, which has an average primary particle size of 10 to 50 nm, and preferably 10 to 20 nm, and an association degree of 1.0 to 1.8, and preferably 1.0 to 1.3. When the average primary particle size is smaller than 10 nm, it becomes difficult to remove the abrasive grains from the surface of the glass substrate after polishing, which leads to an increase in minute defects. When the average primary particle size is greater than 50 nm, polishing marks due to the abrasive grains clearly remain in the surface of the glass substrate, which makes it difficult to obtain surface roughness required for the surface of the EUVL mask blank glass substrate. The association degree is defined as the ratio of an average secondary particle size to the average primary particle size, and the secondary particle refers to a collection (association) of multiple primary particles, so that the association degree is not less than 1. When the association degree is greater than 1.8, the proportion of abrasive grains having shape anisotropy increases, and the surface morphology of glass substrate after polishing also becomes non-uniform, which makes it difficult to obtain surface roughness required for the surface of the EUVL mask blank glass substrate. Thus, by performing finish polishing with colloidal silica whose the particle size and the association degree are controlled, the value of the circularly averaged power spectral density at the spatial frequency of 0.1 $\mu m^{-1}$ or more and 20 $\mu m^{-1}$ less in the region of 10 $\mu m \times 10$ $\mu m$ or less required for the surface of the EUVL mask blank glass substrate can be set in a suitable range.

The average primary particle size is calculated from the specific surface area of abrasive grains measured by a BET method, and the association degree is calculated by dividing an average secondary particle size measured by a dynamic light scattering method by an average primary particle size.

In the cleaning step, the mask blank glass substrate after the finish polishing step is cleaned in a cleaning line including a cleaning tank for an acidic or alkaline etching chemical solution in a single wafer cleaner, and then dried. The etching chemical solution is not particularly limited, and examples thereof include hydrofluoric acid as an acidic solution and an aqueous solution of KOH or NaOH as an alkaline solution.

If the amount of etching by the etching chemical solution is large, the surface roughness of the substrate surface deteriorates, and the value of the circularly averaged power spectral density at the spatial frequency of 0.1 $\mu m^{-1}$ or more and 20 $\mu m^{-1}$ or less also becomes large, whereby the amount of etching is preferably 0.01 nm or less, and more preferably 0.005 nm or less.

On the mask blank glass substrate after cleaning, for example, a Mo/Si periodic laminated film in which Mo films and Si films are alternately laminated is formed. In this case, in order to obtain a multilayer reflective film suitable for EUV light having a wavelength of 13 to 14 nm, it is preferable to alternately laminate about forty to sixty Mo films and Si films each having a film thickness of about several nm.

Subsequently, a protective film composed of, for example, Ru is formed on the multilayer reflective film.

Such a multilayer reflective film or protective film can be formed by, for example, a magnetron sputtering method or an ion beam sputtering method or the like.

In the EUVL, all optical systems are composed of reflective optical systems, whereby a slight difference between reflectances of reflection surfaces is integrated depending on the number of reflections. Therefore, from the viewpoint of throughput and manufacturing cost and the like, it is extremely important to increase the reflectance of each reflection surface as much as possible.

EXAMPLES

Hereinafter, the present invention is described in more detail with reference to Examples and Comparative Examples, but the present invention is not limited to the following Examples.

Example 1

A titania-doped synthetic quartz glass substrate (6 inches) doped with 7 wt % of titania as a raw material was lapped, roughly polished, and then locally polished to remove a high portion using a felt buff tool based on height data of a substrate surface measured with a flatness tester (Ultra Flat, manufactured by Tropel).

Then, the substrate was subjected to final-finish polishing using a soft suede polishing cloth and a colloidal silica aqueous dispersion having $SiO_2$ concentration of 25 wt % (average primary particle size: 14 nm, association degree: 1.3) as an abrasive.

After the completion of the polishing, the surface of the substrate was cleaned in a cleaning line including a cleaning tank for etching the substrate surface by about 0.008 nm using an etching chemical solution adjusted to pH 10 in a single wafer cleaner, and then dried.

When the surface morphology of the obtained glass substrate was measured in a region of 10 $\mu m \times 10$ $\mu m$ using an atomic force microscope (Cypher ES, manufactured by Oxford Instruments), a value of RMS was 0.04 nm; a maximum value of a circularly averaged power spectral density in a region having a spatial frequency of 0.1 $\mu m^{-1}$ or more and 20 $\mu m^{-1}$ or less was 753 $nm^4$; and a coefficient β (fractal coefficient) at 1 $\mu m^{-1}$ or more and 10 $\mu m^{-1}$ or less was 0.7.

When the surface morphology of a region of 6 mm×6 mm was measured with a white light interferometer (Nex View, manufactured by Zygo, the same applies hereinafter), a maximum value of a circularly averaged power spectral density at a spatial frequency of 0.4 $mm^{-1}$ or more and 100 $mm^{-1}$ or less was $0.3 \times 10^{12}$ $nm^4$. Furthermore, the flatness (TIR) of a region of 142 mm×142 mm was 28 nm.

Next, a multilayer reflective film (thickness: 300 nm) in which sixty Mo films and sixty Si films were alternately laminated on the main surface of the above-described mask blank glass substrate, and a protective film (thickness: 2.5 nm) composed of Ru were formed by an ion beam sputtering method to prepare a multilayer reflective film-attached substrate. The reflectance of EUV light (wavelength: 13.5 nm, the same applies hereinafter) measured on the main surface of the multilayer reflective film-attached substrate was 65.8%.

Example 2

A mask blank glass substrate was prepared under the same conditions as those in Example 1 except that, after the completion of final-finish polishing, the surface of a substrate was cleaned in a cleaning line including, a cleaning tank for etching the surface of the substrate by about 0.005 nm using an etching chemical solution adjusted to pH 9 in a single wafer cleaner, and then dried.

When the surface morphology of the obtained glass substrate was measured in a region of 10 $\mu m \times 10$ $\mu m$ using an atomic force microscope in the same manner as with Example 1, a value of RMS was 0.04 nm; a maximum value of a circularly averaged power spectral density in a region having a spatial frequency of 0.1 $\mu m^{-1}$ or more and 20 $\mu m^{-1}$ or less was 721 $nm^4$; and a coefficient β (fractal coefficient) at 1 $\mu m^{-1}$ or more and 10 $\mu m^{-1}$ or less was 0.8.

When the surface morphology of a region of 6 mm×6 mm was measured with a white light interferometer, a maximum value of a circularly averaged power spectral density at a spatial frequency of 0.4 $mm^{-1}$ or more and 100 $mm^{-1}$ or less was $0.1 \times 10^{12}$ $nm^4$. Furthermore, the flatness (TIR) of a region of 142 mm×142 mm was 27 nm.

Next, a multilayer reflective film and a protective film were formed on the main surface of the above-described mask blank glass substrate under the same conditions as those in Example 1 to prepare a multilayer reflective film-attached substrate. The reflectance of EUV light measured on the main surface of the multilayer reflective film-attached substrate was 66.0%.

Comparative Example 1

A mask blank glass substrate was prepared under the same conditions as those in Example 1 except that, as an abrasive used for final-finish polishing, a colloidal silica aqueous dispersion having a $SiO_2$ concentration of 25 wt % (average primary particle size: 28 nm, association degree: 1.7) was used, and a cleaning step using hydrofluoric acid for 0.5 nm etching was added.

When the surface morphology of the obtained glass substrate was measured in a region of 10 μm×10 μm using an atomic force microscope in the same manner as with Example 1, a value of RMS was 0.07 nm; a maximum value of a circularly averaged power spectral density in a region having a spatial frequency of 0.1 $μm^{-1}$ or more and 20 $μm^{-1}$ or less was 1172 $nm^4$; and a coefficient β (fractal coefficient) at 1 $μm^{-1}$ or more and 10 $μm^{-1}$ or less was 0.6.

When the surface morphology of a region of 6 mm×6 mm was measured with a white light interferometer, a maximum value of a circularly averaged power spectral density of the spatial frequency of 0.4 $mm^{-1}$ or more and 100 $mm^{-1}$ or less was $1.2×10^{12}$ $mm^4$. Furthermore, the flatness (TIR) of a region of 142 mm×142 mm was 29 nm.

Next, a multilayer reflective film and a protective film were formed on the main surface of the above-described mask blank glass substrate under the same conditions as those in Example 1, to prepare a multilayer reflective film-attached substrate. The reflectance of EUV light measured on the main surface of the multilayer reflective film-attached substrate was 64.2%.

In Comparative Example 1, a result of performing final-finish polishing with an abrasive having a relatively large particle size to increase an amount of etching in a cleaning step, in the surface morphology of the obtained mask blank glass substrate, the maximum value of the circularly averaged power spectral density in the region of 0.1 $μm^{-1}$ or more and 20 $μm^{-1}$ or less increased to 1,172 $nm^4$.

As a result, the reflectance of the multilayer reflective film-attached substrate obtained by forming the film on the glass substrate as described above is a low value of 64.2%. When pattern exposure is performed using a mask blank obtained from the multilayer reflective film-attached substrate, the low reflectance requires a long time, which causes a concern that throughput decreases.

Comparative Example 2

A mask blank glass substrate was prepared under the same conditions as in those of Example 1 except that a colloidal silica aqueous dispersion having a $SiO_2$ concentration of 25 wt % (average primary particle size: 28 nm, association decree: 1.7) was used as an abrasive used for final-finish polishing.

When the surface morphology of the obtained glass substrate was measured in a region of 10 μm×10 μm using an atomic force microscope in the same manner as in Example 1, a value of RMS was 0.06 nm; a maximum value of a circularly averaged power spectral density in a region having a spatial frequency of 0.1 $μm^{-1}$ or more and 20 $μm^{-1}$ or less was 1,035 $nm^4$; and a coefficient β (fractal coefficient) at 1 $μm^{-1}$ or more and 10 $μm^{-1}$ or less was 0.6.

When the surface morphology of a region of 6 mm×6 mm was measured with a White light interferometer, a maximum value of a circularly averaged power spectral density at a spatial frequency of 0.4 $mm^{-1}$ or more and 100 $mm^{-1}$ or less was $1.1×10^{12}$ $nm^4$. Furthermore, the flatness (TIR) of a region of 142 mm×142 mm was 29 nm.

Next, a multilayer reflective film and a protective film were formed on the main surface of the above-described mask blank glass substrate under the same conditions as those in Example 1, to prepare a multilayer reflective film-attached substrate. The reflectance of EUV light measured on the main surface of the multilayer reflective film-attached substrate was 64.4%.

In Comparative Example 2, final-finish polishing was performed with an abrasive having a relatively large particle size as with Comparative Example 1, to suppress an amount of etching in a cleaning step, but as a result, for the surface of the obtained mask blank glass substrate, a maximum value of a circularly averaged power spectral density in a region of 0.1 $μm^{-1}$ or more and 20 $μm^{-1}$ or less was a relatively large value of 1,035 $nm^4$.

As a result, the reflectance of the multilayer reflective film-attached substrate obtained by forming the film on the glass substrate as described above is a relatively low value of 64.4%. When a mask blank obtained from such a substrate is used, there is a concern that throughput during exposure decreases as with Comparative Example 1.

The difference between the reflectance of Comparative Example 2 and the reflectance of Example 1 seems to be as small as 1.4% point, but as described above, in an EUVL optical system composed entirely of a reflective optical system, it is extremely important to increase the reflectance of each reflection surface as much as possible. When the case where the reflectance of each reflection surface is 64.4% (Comparative Example 2) is compared with the case where the reflectance is 65.8% (Example 1) in an exposure apparatus in which the number of reflections in the system is 10, the amount of EUV light on the exposed surface in the latter is 1.24 times higher. When the case where the reflectance of each reflection surface is 64.2% (Comparative Example 1) is compared with the case where the reflectance is 66.0% (Example 2), the amount of EUV light on the exposed surface in the latter is 1.32 times higher. These differences are never ignorable from the viewpoint of throughput and manufacturing cost.

Japanese Patent Application No. 2020-099745 is incorporated herein by reference.

Although some preferred embodiments have been described, many modifications to and variations may be made thereto in light of the above teachings. It is therefore to be understood that the invention may be practiced otherwise than as specifically described without departing from the scope of the appended claims.

The invention claimed is:

1. A mask blank for extreme ultra violet lithography (EUVL) comprising a glass substrate having a maximum value of a circularly averaged power spectral density of 1,000 $nm^4$ or less at a spatial frequency of 0.1 $μm^{-1}$ or more and 20 $μm^{-1}$ or less, the maximum value being obtained by measuring a surface morphology of a region of 10 μm×10 μm with an atomic force microscope and a multilayer reflective film laminated on the glass substrate.

2. The mask blank for EUVL according to claim 1, wherein a protective film is further formed on the multilayer reflective film.

3. The mask blank for EUVL according to claim 2, wherein the protective film composed of Ru.

4. The mask blank for EUVL according to claim 1, wherein the multilayer reflective film is a Mo/Si periodic laminated film in which Mo films and Si films are alternately laminated.

5. The mask blank for EUVL according to claim 4, wherein the Mo/Si periodic laminated film is a film in which Mo films and Si films are alternately laminated about forty to sixty Mo films and Si films.

6. The mask blank for EUVL according to claim 1, wherein, when the circularly averaged power spectral density of the glass substrate is expressed by a function $af^\beta$ of the spatial frequency (f), a coefficient β (fractal coefficient) at the spatial frequency (f) of 1 μm$^{-1}$ or more and 10 μm$^{-1}$ or less is 0.7 or more.

7. The mask blank for EUVL according to claim 1, wherein a value of surface roughness of the glass substrate (RMS) obtained by measuring the surface morphology of the region of 10 μm×10 μm with the atomic force microscope is 0.15 nm or less.

8. The mask blank for EUVL according to claim 1 wherein a maximum value of a circularly averaged power spectral density of the glass substrate at a spatial frequency of 0.4 mm$^{-1}$ or more and 100 mm$^{-1}$ or less is $10^{12}$ nm$^4$ or less, the maximum value being obtained by measuring a surface morphology of a region of 6 mm×6 mm with a white light interferometer.

9. The mask blank for EUVL according to claim 1, wherein flatness (TIR) of a region of 142 mm×142 mm of the glass substrate is 100 nm or less.

10. The mask blank for EUVL according claim 1, wherein the glass substrate is a titania-doped synthetic quartz glass substrate containing 5 to 10 wt % of titania.

\* \* \* \* \*